United States Patent
Atsumi et al.

(10) Patent No.: US 8,558,238 B2
(45) Date of Patent: Oct. 15, 2013

(54) SEMICONDUCTOR DEVICE AND METHOD FOR MANUFACTURING SEMICONDUCTOR DEVICE

(75) Inventors: Tomoaki Atsumi, Isehara (JP); Hiroki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 618 days.

(21) Appl. No.: 11/802,458

(22) Filed: May 23, 2007

(65) Prior Publication Data

US 2007/0290207 A1    Dec. 20, 2007

(30) Foreign Application Priority Data

Jun. 1, 2006    (JP) ................................. 2006-153548

(51) Int. Cl.
*H01L 29/10*    (2006.01)

(52) U.S. Cl.
USPC .................................... 257/66; 257/E29.002

(58) Field of Classification Search
USPC .............. 438/166, 487, 149–153; 257/66–75, 257/E29.002, E29.003, E29.012
See application file for complete search history.

(56) References Cited

U.S. PATENT DOCUMENTS

| | | | |
|---|---|---|---|
| 4,929,998 A | 5/1990 | Boudewijns | |
| 5,477,178 A | 12/1995 | Maki | |
| 5,501,989 A | 3/1996 | Takayama et al. | |
| 5,599,724 A * | 2/1997 | Yoshida | 438/192 |
| 5,731,613 A | 3/1998 | Yamazaki et al. | |
| 5,734,583 A | 3/1998 | Shou et al. | |
| 5,952,952 A | 9/1999 | Choi et al. | |
| 5,959,313 A | 9/1999 | Yamazaki et al. | |
| 5,962,872 A | 10/1999 | Zhang et al. | |
| 5,981,974 A | 11/1999 | Makita | |
| 6,144,080 A * | 11/2000 | Wada et al. | 257/394 |
| 6,239,662 B1 | 5/2001 | Fukayama et al. | |

(Continued)

FOREIGN PATENT DOCUMENTS

| | | |
|---|---|---|
| EP | 0 186 239 | 7/1986 |
| EP | 0 704 904 | 4/1996 |

(Continued)

OTHER PUBLICATIONS

Search Report (Application Serial No. 07010163.9) dated Sep. 12, 2007.

(Continued)

*Primary Examiner* — Matthew W Such
*Assistant Examiner* — Ali Naraghi
(74) *Attorney, Agent, or Firm* — Eric J. Robinson; Robinson Intellectual Property Law Office, P.C.

(57) ABSTRACT

In a semiconductor device including a digital circuit portion and an analog circuit portion having a capacitor portion provided over a substrate, the capacitor portion is provided with a first wiring, a second wiring and a plurality of blocks each having a plurality of capacitor elements. Further, each the plurality of capacitor elements provided in each block has a semiconductor film having a first impurity region and a plurality of second impurity regions provided apart with the first impurity region interposed therebetween, and a conductive film provided over the first impurity region with an insulating film therebetween. A capacitor is formed from the first impurity region, the insulating film, and the conductive film.

18 Claims, 11 Drawing Sheets

(56) References Cited

U.S. PATENT DOCUMENTS

| | | |
|---|---|---|
| 6,396,078 B1 | 5/2002 | Uochi et al. |
| 6,439,514 B1 | 8/2002 | Yamaguchi et al. |
| 6,495,858 B1 | 12/2002 | Zhang |
| 6,545,318 B1 | 4/2003 | Kunikiyo |
| 6,549,184 B1 | 4/2003 | Koyama et al. |
| 6,593,235 B2 | 7/2003 | Uochi et al. |
| 6,603,160 B1 | 8/2003 | Zhang |
| 6,611,015 B2 | 8/2003 | Okazaki et al. |
| 6,677,613 B1 | 1/2004 | Yamazaki et al. |
| 6,797,550 B2* | 9/2004 | Kokubo et al. ............... 438/164 |
| 6,818,469 B2 | 11/2004 | Mori et al. |
| 6,867,431 B2 | 3/2005 | Konuma et al. |
| 7,019,491 B2 | 3/2006 | Bozzone et al. |
| 7,022,531 B2 | 4/2006 | Okazaki et al. |
| 7,059,190 B2 | 6/2006 | Sakai et al. |
| 7,079,371 B2 | 7/2006 | Yamasaki |
| 7,148,093 B2 | 12/2006 | Makita |
| 7,161,176 B2 | 1/2007 | Yamazaki et al. |
| 7,177,135 B2 | 2/2007 | Kim et al. |
| 7,345,335 B2 | 3/2008 | Watanabe |
| 7,494,066 B2 | 2/2009 | Koyama et al. |
| 7,531,011 B2 | 5/2009 | Yamasaki |
| 7,655,518 B2 | 2/2010 | Kim et al. |
| 7,686,052 B2 | 3/2010 | Song et al. |
| 7,723,725 B2 | 5/2010 | Yamazaki et al. |
| 7,800,178 B2 | 9/2010 | Makita |
| 7,942,338 B2 | 5/2011 | Koyama et al. |
| 8,067,278 B2 | 11/2011 | Makita |
| 8,313,035 B2 | 11/2012 | Koyama et al. |
| 2001/0000414 A1 | 4/2001 | Fukayama et al. |
| 2002/0089049 A1 | 7/2002 | Leduc et al. |
| 2002/0113239 A1* | 8/2002 | Uochi et al. .................... 257/72 |
| 2003/0137480 A1 | 7/2003 | Koyama et al. |
| 2003/0218213 A1 | 11/2003 | Ipposhi et al. |
| 2004/0021166 A1 | 2/2004 | Hyde et al. |
| 2004/0089890 A1 | 5/2004 | Burnett |
| 2004/0124498 A1 | 7/2004 | Tanaka et al. |
| 2004/0129450 A1 | 7/2004 | Yamazaki et al. |
| 2004/0212041 A1 | 10/2004 | Takamatsu et al. |
| 2005/0006687 A1 | 1/2005 | Dirnecker et al. |
| 2005/0041005 A1 | 2/2005 | Yamazaki et al. |
| 2005/0090046 A1 | 4/2005 | Young |
| 2005/0134435 A1 | 6/2005 | Koyama et al. |
| 2006/0022246 A1* | 2/2006 | Honda ........................ 257/296 |
| 2006/0068536 A1 | 3/2006 | Yamazaki |
| 2006/0175612 A1 | 8/2006 | Yamazaki et al. |
| 2007/0210364 A1 | 9/2007 | Kato et al. |
| 2009/0058786 A1 | 3/2009 | Ku |

FOREIGN PATENT DOCUMENTS

| | | |
|---|---|---|
| JP | 61-156851 A | 7/1986 |
| JP | 02-137255 | 5/1990 |
| JP | 07-045789 | 2/1995 |
| JP | 07-058207 A | 3/1995 |
| JP | 08-111505 A | 4/1996 |
| JP | 08-204130 A | 8/1996 |
| JP | 08-213627 | 8/1996 |
| JP | 08-306880 A | 11/1996 |
| JP | 09-251996 A | 9/1997 |
| JP | 11-003979 A | 1/1999 |
| JP | 11-068050 A | 3/1999 |
| JP | 2000-138346 A | 5/2000 |
| JP | 2000-223665 A | 8/2000 |
| JP | 2000-223722 A | 8/2000 |
| JP | 2000-315734 A | 11/2000 |
| JP | 2001-007292 A | 1/2001 |
| JP | 2002-057350 | 2/2002 |
| JP | 2002-094022 A | 3/2002 |
| JP | 2002-123805 | 4/2002 |
| JP | 2002-366917 | 12/2002 |
| JP | 2004-039699 A | 2/2004 |
| JP | 2004-056097 A | 2/2004 |
| JP | 2005-101609 A | 4/2005 |
| JP | 2005-114564 A | 4/2005 |
| JP | 2005-191266 A | 7/2005 |
| JP | 2005-202943 A | 7/2005 |
| JP | 2005-353760 A | 12/2005 |
| KR | 2004-0063782 A | 7/2004 |
| WO | WO-2005/101609 | 10/2005 |
| WO | WO 2005/106961 | 11/2005 |
| WO | WO 2006/022169 | 3/2006 |
| WO | WO 2006/022196 | 3/2006 |

OTHER PUBLICATIONS

'Chinese Office Action (Application No. 200710106488.6) Dated Sep. 8, 2010,'.

Korean Office Action (Application No. 2007-0053308) Dated May 8, 2013.

Taiwanese Office Action (Application No. 96118828) Dated Mar. 22, 2013.

* cited by examiner

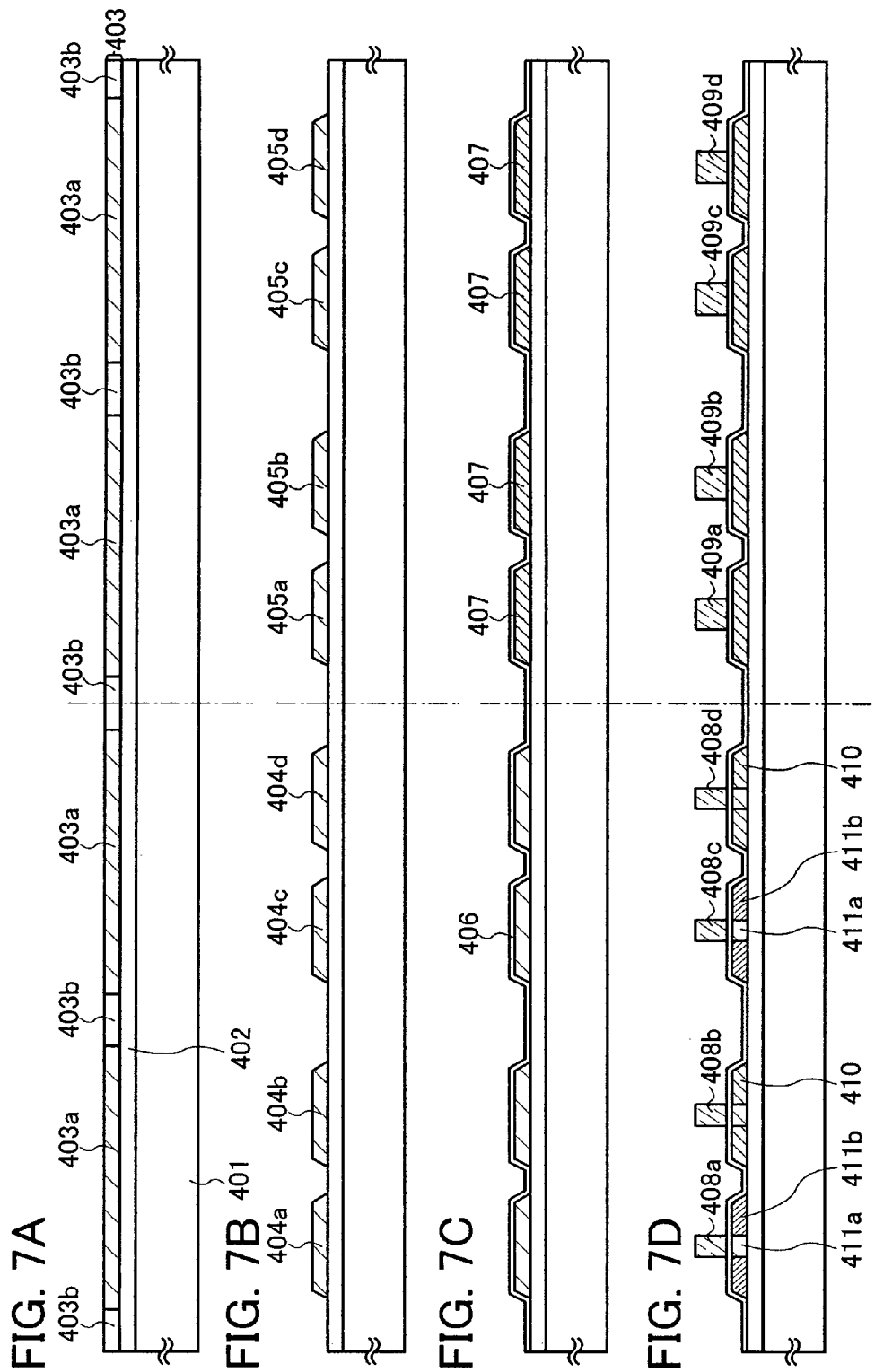

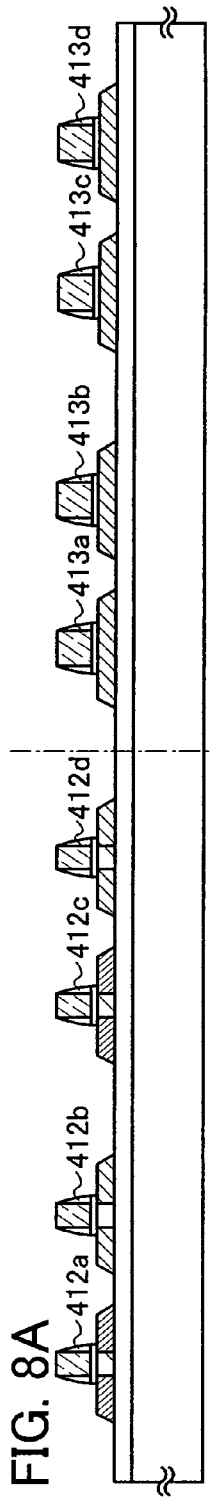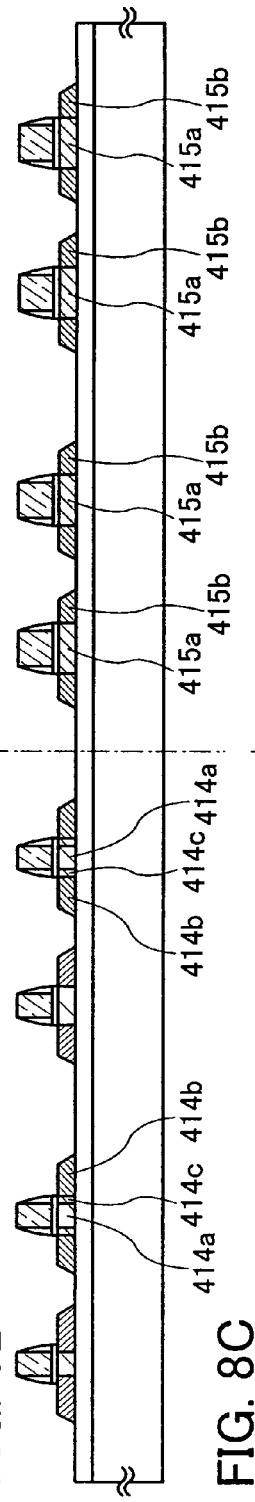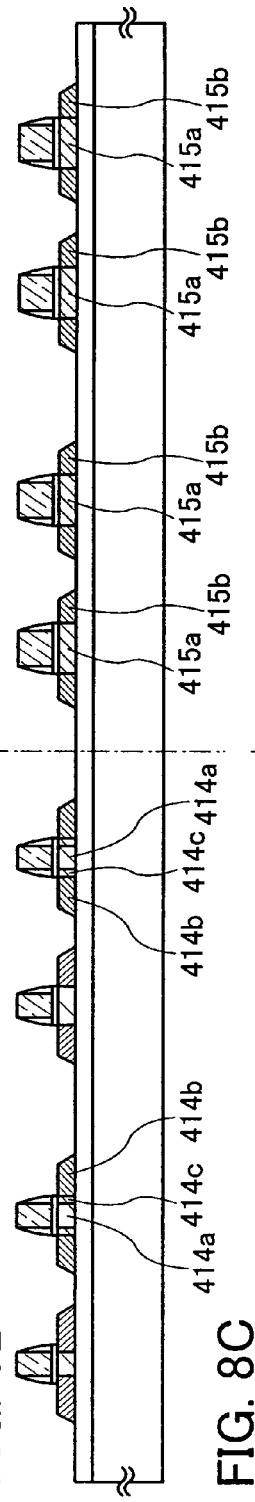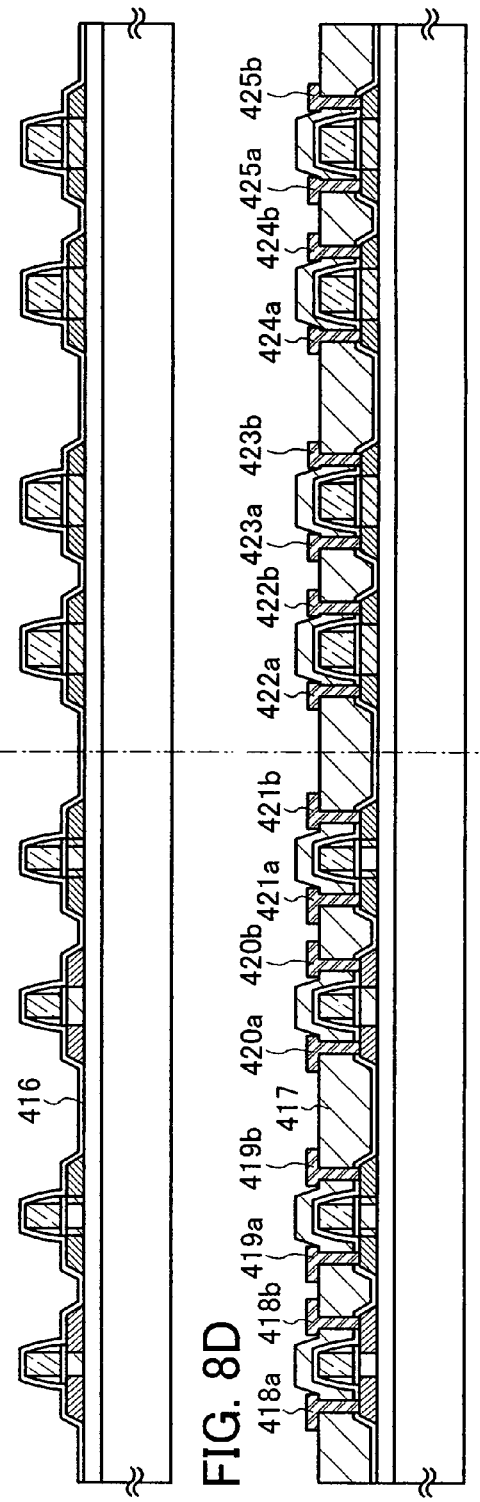

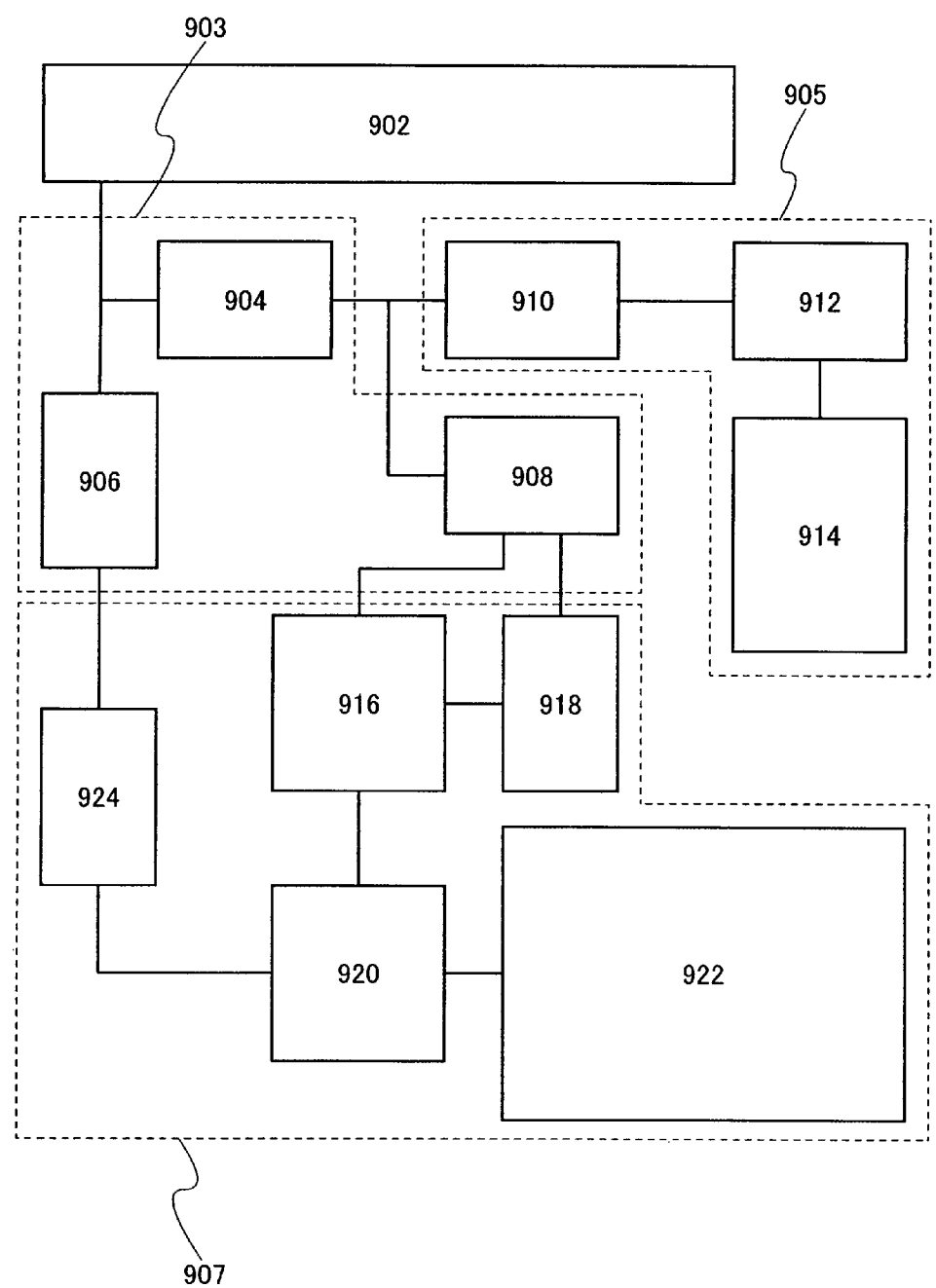

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device, particularly, a method for manufacturing a semiconductor device using a thin film transistor.

2. Description of the Related Art

In recent years, IT (Information Technology) penetrates the world due to the propagation of the Internet, which has brought revolution. In particular, as expressed as a ubiquitous information society, nowadays, the environment making it possible to access networks everywhere at any time has been developed. In such an environment, individual verification technologies attract attention, in which an ID (identification code) is assigned to an individual object thereby specifying the history of the object and it is applied to production, management, or the like.

Among them, currently, a semiconductor device in which a micro IC chip manufactured using a single crystal Si substrate and an antenna for wireless communication are combined (also referred to as an RFID (Radio Frequency Identification) tag, an ID tag, an IC tag, a wireless tag, a wireless chip, or an electron tag) are spotlighted. The semiconductor device makes it possible to write data or read data by using a wireless communication device (hereinafter referred to as a "reader/writer").

As an application field of such a semiconductor device, for example, product management in distribution industry can be given. At present, product management using barcodes or the like is a mainstream; however, since data of barcodes are read optically, they cannot be read when a shield exists. On the other hand, as to the semiconductor device described above, since data are read wirelessly, they can be read even when a shield exists. Thus, higher efficiency, lower cost, and the like of product management are expected. In addition, wide use of the semiconductor devices in IC cards, labels provided with IC tags, tickets, air tickets, automatic checkout, and the like is expected (for example, Reference 1: Japanese Published Patent Application No. 2002-366917 and Japanese Published Patent Application No. 2002-123805).

Further, for providing semiconductor devices such as RFID tags or the like on a variety of products, it is desirable to provide the semiconductor devices at low cost. However, in the case of manufacturing a semiconductor device using a single crystal Si substrate, since a single crystal Si substrate is expensive, reduction in cost is limited. In addition, Si substrates are used in different fields so that there are concerns of the short supply of Si substrates if a great number of Si substrates are used. Therefore, when a single crystal Si substrate is used, cost reduction is more difficult.

Meanwhile, in order to provide semiconductor devices at low cost, techniques in which a semiconductor device is formed using a semiconductor thin film formed over a glass substrate or a plastic substrate are studied. In the case of using such a substrate, the area and the shape are not particularly limited. For example, when a rectangular shape having 1 meter or more on one side is used, improvement in productivity and reduction in manufacturing cost are expected as compared with the case of using a circular silicon substrate.

Further, when a semiconductor device using a semiconductor film is manufactured, a crystalline semiconductor thin film is used to improve the signal processing speed and the like of the semiconductor device. However, there are problems in that the processing speed, communication distance, and the like depend on a crystal state of the semiconductor thin film formed over a substrate, or the layout of circuits formed using the semiconductor thin film or the like, for example. Hereafter, cost reduction, high processing speed, and longer communication distance with respect to such semiconductor devices are increasingly required.

SUMMARY OF THE INVENTION

It is a feature of the present invention is to provide a semiconductor device which makes it possible to achieve high speed signal processing and ensure a certain communication distance even in the case of using a semiconductor thin film formed over a substrate and to provide a method for manufacturing the semiconductor device.

A semiconductor device of one aspect of the present invention includes a capacitor portion including a first wiring, a second wiring and a plurality of blocks each including a plurality of capacitor elements. Each of the plurality of capacitor elements includes a semiconductor film having a first impurity region and a plurality of second impurity regions provided apart with the first impurity region interposed therebetween, and a conductive film provided over the first impurity region with an insulating film therebetween. A capacitor is formed with the first impurity region, the insulating film, and the conductive film, the conductive film is electrically connected to the first wiring, the second impurity regions are electrically connected to the second wiring, and the plurality of capacitor elements are connected in parallel with each other. A block here refers to a group (cluster) in which the plurality of capacitor elements are provided. More specifically, a block refers to a group (cluster) in which a plurality of semiconductor films included in the capacitor elements are provided collectively.

A semiconductor device of one aspect of the present invention includes a capacitor portion including a first wiring, a second wiring and a plurality of blocks each including a plurality of capacitor elements. Each of the plurality of capacitor elements includes a semiconductor film having a first impurity region and a plurality of second impurity regions provided apart with the first impurity region interposed therebetween, and a conductive film provided over the first impurity region with an insulating film therebetween. A capacitor is formed with the first impurity region, the insulating film, and the conductive film, the conductive films provided in the plurality of capacitor elements are connected to each other through the first wiring, and the second impurity regions provided in the plurality of capacitor elements are electrically connected to each other through the second wiring.

In the above structures of the semiconductor device of the present invention, the first wiring and the second wiring may be provided on one plane. Further, the plurality of capacitor elements provided in the plurality of blocks may be connected in parallel with each other. Moreover, the first wiring may be provided using a material having lower resistance than the conductive film.

In the above structure of a semiconductor device of the present invention, in the plurality of blocks, a distance between the semiconductor films each provided in different blocks may be 20 μm to 200 μm.

A method for manufacturing a semiconductor device of one aspect of the present invention includes the steps of: forming a plurality of blocks having a plurality of semiconductor films over a substrate; forming first impurity regions by introducing a first impurity element into the plurality of semiconductor films; forming a first insulating film so as to cover the plurality of semiconductor films; selectively forming conductive films respectively over the plurality of semiconductor films so as to cover parts of the semiconductor films with the first insulating film therebetween; introducing a second impurity element into the plurality of semiconductor films using the conductive films as masks thereby forming second impurity regions in regions which do not overlap with the conductive films; forming a second insulating film so as to cover the plurality of semiconductor films and the conductive films; and over the second insulating film, forming a first wiring electrically connected to the conductive films and a second wiring electrically connected to the second impurity regions. The first wiring is provided so that the conductive films formed over the plurality of semiconductor films are electrically connected to each other; and the second wiring is provided so that the second impurity regions formed in the plurality of semiconductor films are electrically connected to each other.

Further, a method for manufacturing a semiconductor device of one aspect of the present invention includes the steps of: forming a semiconductor film over a substrate; irradiating the semiconductor film with laser light thereby forming a crystalline semiconductor film; selectively etching the crystalline semiconductor film thereby providing a plurality of blocks having a plurality of crystalline semiconductor films; forming first impurity regions by introducing a first impurity element into the plurality of crystalline semiconductor films; forming a first insulating film so as to cover the plurality of crystalline semiconductor films; selectively forming conductive films respectively over the plurality of crystalline semiconductor films so as to cover parts of the crystalline semiconductor films with the first insulating film therebetween; introducing a second impurity element into the plurality of crystalline semiconductor films using the conductive films as masks thereby forming second impurity regions in regions which do not overlap with the conductive films; forming a second insulating film so as to cover the plurality of crystalline semiconductor films and the conductive films; and over the second insulating film, forming a first wiring electrically connected to the conductive films and a second wiring electrically connected to the second impurity regions. The first wiring is provided so that the conductive films formed over the plurality of crystalline semiconductor films are electrically connected to each other; and the second wiring is provided so that the second impurity regions formed in the plurality of crystalline semiconductor films are electrically connected to each other.

In the above methods for manufacturing a semiconductor device of the present invention, concentration of an impurity element contained in the first impurity region may be lower than concentration of an impurity element contained in the second impurity regions. Further, the first wiring may be formed of a material having lower resistance than the conductive film.

In the above methods for manufacturing a semiconductor device of the present invention, a shortest distance between the semiconductor films provided in each of the plurality of blocks may be 20 mm to 200 mm.

Circuits and capacitor elements are formed using a semiconductor film of a large grain crystal region formed by laser light irradiation, so that higher signal processing speed is realized and a certain communication distance can be ensured.

BRIEF DESCRIPTION OF DRAWINGS

FIGS. 7A to 7D are diagrams showing an example of a method for manufacturing a semiconductor device of the present invention;

FIGS. 8A to 8D are diagrams showing an example of a method for manufacturing a semiconductor device of the present invention;

FIG. 9 is a diagram showing an example of a semiconductor of the present invention;

DETAILED DESCRIPTION OF THE INVENTION

Figure 1:
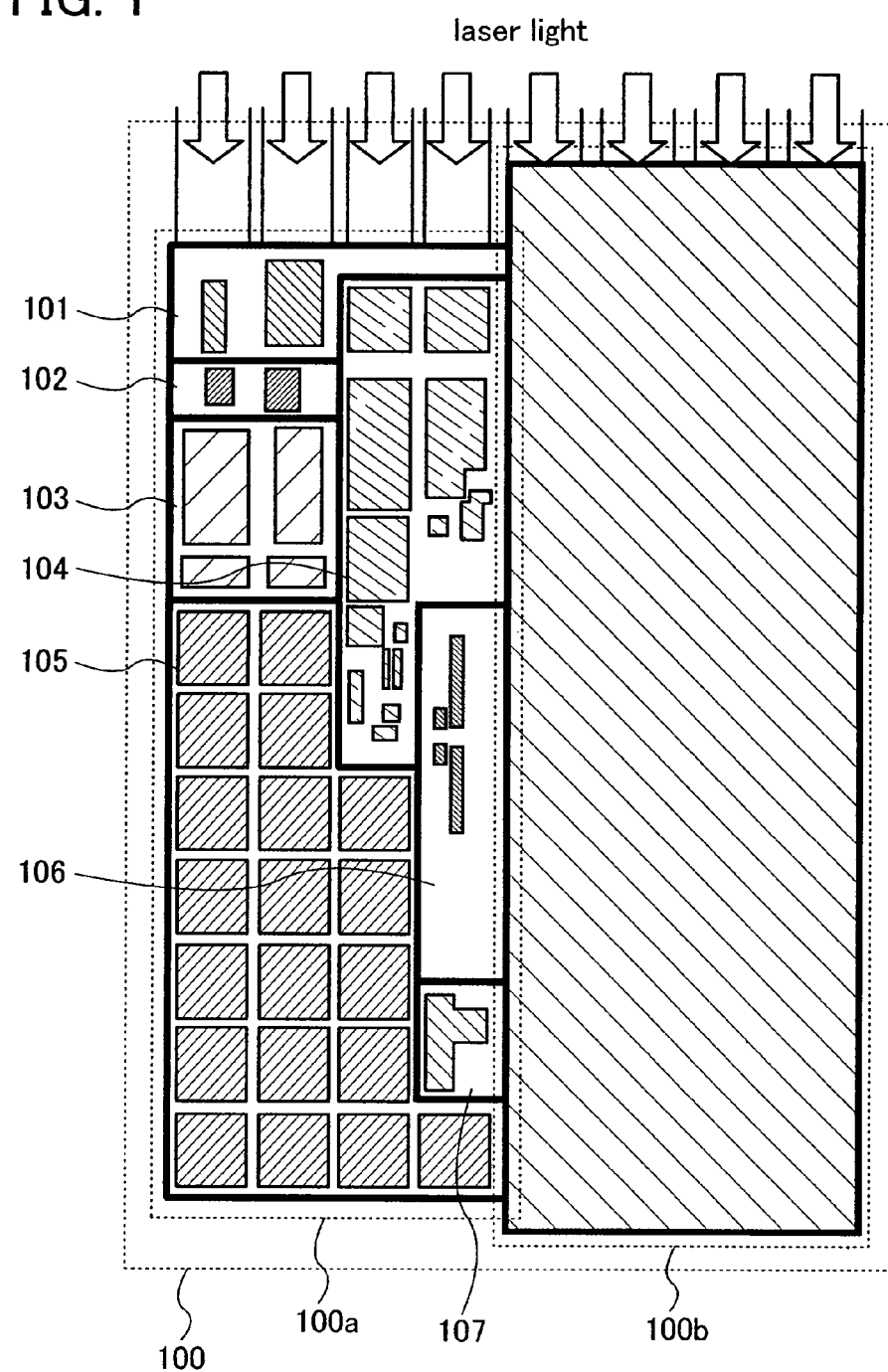
FIG. 1 is a diagram showing an example of a semiconductor device of the present invention.

Embodiment modes of the present invention will be hereinafter described with reference to the drawings. However, it is easily understood by those skilled in the art that the present invention is not limited to the following description and that the modes and details can be variously changed without departing from the scope and spirit of the present invention. Therefore, the present invention is not construed as being limited to the description of the embodiment modes hereinafter shown. In the structure of the present invention described below, the like reference numerals may denote the like parts throughout the drawings.

Embodiment Mode 1

In this embodiment mode, a semiconductor device of the present invention will be described with respect to drawings.

A semiconductor device 100 of the invention includes an analog circuit portion 100a and a digital circuit portion 100b. The analog circuit portion 100a and the digital circuit portion 100b are provided to be separated from each other (See FIG. 1). The analog circuit portion 100a includes a demodulation circuit 101, a modulation circuit 102, a rectification circuit 103, a constant voltage circuit 104, a capacitor portion 105, an oscillator circuit 106, a reset circuit 107, and the like. The digital circuit portion 100b includes a memory portion, a memory circuit, and the like.

Further, circuits formed in the analog circuit portion 100a and the digital circuit portion 100b includes thin film transistors or the like formed over a substrate. The capacitor portion 105 is provided with a plurality of capacitor elements manufactured using the semiconductor thin film formed over the substrate. An example of a cross-sectional structure of the thin film transistors and the capacitor elements will be described with reference to FIGS. 2A and 2B.

Figure 2A:
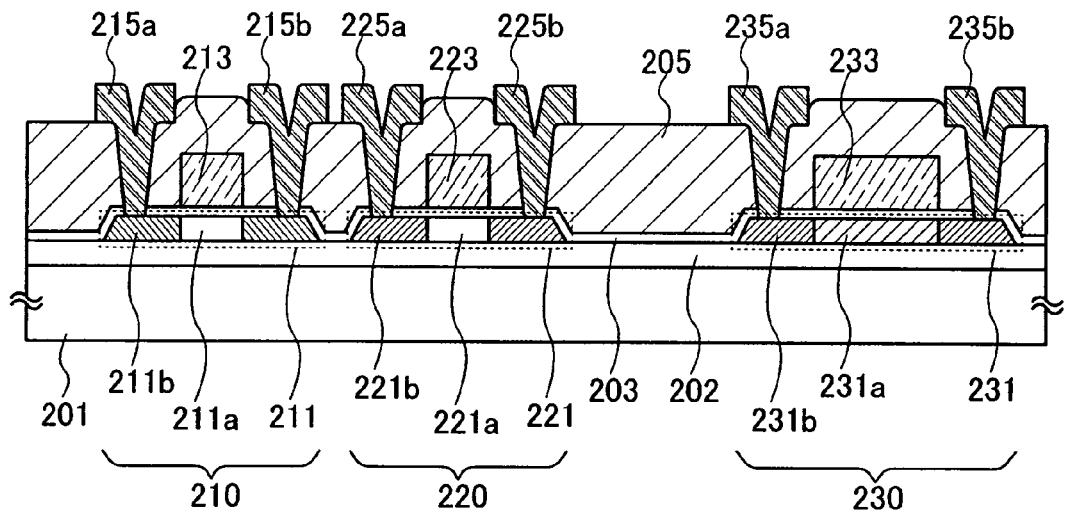
FIGS. 2A and 2B are diagrams showing examples of a semiconductor device of the present invention.

FIG. 2A shows an example in which thin film transistors 210 and 220 and a capacitor element 230 is provided over a substrate 201. Here, the case where the thin film transistor 210 is a p-channel type and the thin film transistor 220 is an n-channel type will be described.

The thin film transistor 210 at least includes a semiconductor film 211, which is provided over the substrate 201 with an insulating film 202 therebetween, an insulating film 203 serving as a gate insulating film which is provided over the semiconductor film 211, and a gate electrode 213 provided over the insulating film 203. The semiconductor film 211 has a channel formation region 211a provided below the gate electrode 213 and impurity regions 211b each of which serves as a source region or a drain region and which are spaced apart with the channel formation region 211a interposed therebetween.

Further, the thin film transistor 220 similarly includes a semiconductor film 221 formed over the substrate 201 with the insulating film 202 therebetween, the insulating film 203 serving as a gate insulating film which is formed over the semiconductor film 221, a gate electrode 223 formed over the insulating film 203. The semiconductor film 221 has a channel formation region 221a provided below the gate electrode 223, and impurity regions 221b each of which serves as a source region or a drain region and which are spaced apart with the channel formation region 221a interposed therebetween.

Further, the capacitor element 230 at least includes a semiconductor film 231 provided over the substrate 201 with the insulating film 202 therebetween, the insulating film provided over the semiconductor film 231, and a conductive film 233 provided over the insulating film 203. The capacitor is formed with the semiconductor film 231, the insulating film 203, and the conductive film 233. The semiconductor film 231 has a first impurity region 231a provided below the conductive film 233, and second impurity regions 231b which are provided apart with the first impurity region 231a interposed therebetween. Here, in the capacitor element 230, the semiconductor film 231 and the conductive film 233 function as electrodes.

Further, the insulating film 205 is provided to cover the thin film transistors 210 and 220, and the capacitor element 230, and conductive films 215a, 215b, 225a, 225b, 235a, and 235b are formed over the insulating film 205. Specifically, the conductive films 215a and 215b are provided so as to electrically connect respectively to the impurity region 211b serving as a source region and the impurity region 211b serving as a drain region which are provided apart with the thin film transistor 210 interposed therebetween. Further, the conductive films 225a and 225b are provided so as to electrically connect respectively to the impurity region 221b serving as a source region and the impurity region 221b serving as a drain region which are provided apart. Still further, the conductive films 235a and 235b are provided so as to electrically connect respectively to the second impurity regions 231b provided apart in the capacitor element 230, and are provided so that the conductive film 235a and the conductive film 235b are electrically connected to each other on the insulating film 205.

Figure 2B:
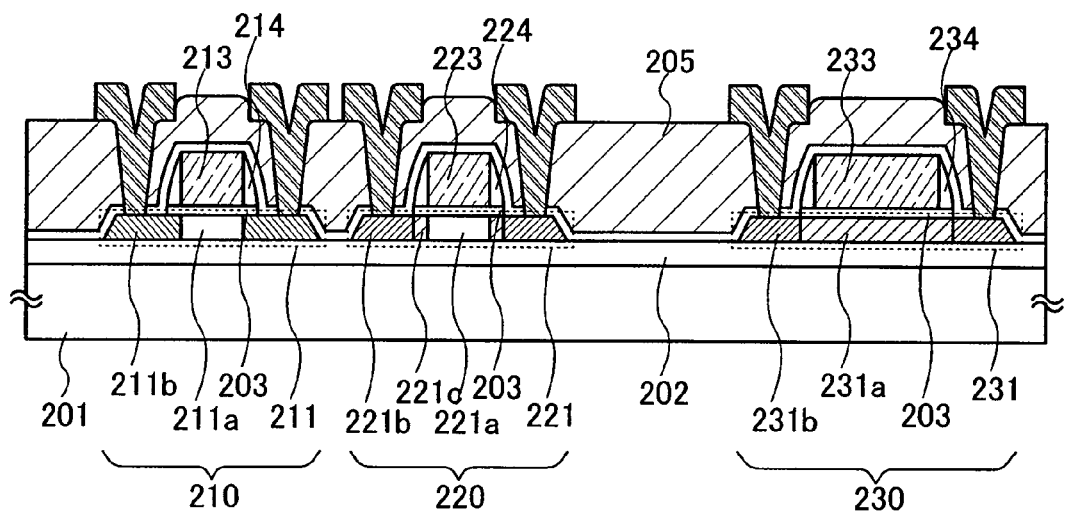

Further, the above-described structure may be further provided with an LDD region in one or each of the thin film transistors 210 and 220 (FIG. 2B). For example, in the n-channel thin film transistor 220, insulating films 224 (also referred to as sidewalls) may be formed in contact with side surfaces of the gate electrode 223, to form a structure in which impurity regions 221c serving as LDD regions are provided below the insulating film 224. In this case, insulating films 214 are formed in contact with side surfaces of the gate electrode 213 of the thin film transistor 210, and insulating films 234 are formed in contact with side surfaces of the conductive film 233 of the capacitor element 230. Here, an example in which the impurity regions 221c serving as LDD regions are provided in the n-channel thin film transistor 220 is described; alternatively, LDD regions may be provided in the p-channel thin film transistor 210.

Further, in a semiconductor device of the invention, crystalline semiconductor films are used as the semiconductor films 211 and 221 which are formed over the substrate 201. A thin film transistor using a crystalline semiconductor film has higher electric field effect mobility (mobility), and the operation speed can be improved as compared with a thin film transistor using an amorphous semiconductor film. In this embodiment mode, a crystalline semiconductor film can be formed, for example, by forming an amorphous semiconductor film of amorphous silicon or the like over a substrate and crystallizing the amorphous semiconductor film by irradiation with laser light (laser annealing). In particular, when a glass substrate or the like which is not highly thermostable is used as the substrate, it is very advantageous to use laser annealing for crystallizing of the semiconductor film for avoiding thermal deformation of the substrate. The laser annealing method here refers to a technique of annealing a damaged layer or an amorphous layer formed in a semiconductor film, or a technique of crystallizing an amorphous semiconductor film formed over a substrate.

Generally, when a semiconductor film formed over a substrate is irradiated with laser light, the laser light is shaped to have a linear shape (including a rectangular shape, an elliptical shape, or the like) having a long side and a short side to obtain energy required for crystallization, thereby scanning the laser light in the short side direction. In the laser semiconductor film irradiated with light, crystal grains with large grain sizes extending along the scan direction of the linear laser light are formed. The width of the crystal region obtained by scanning at a time is almost the same as the length of the long side of the laser shaped into a linear. Accordingly, in order to crystallize the whole semiconductor film formed over the entire surface of the substrate, laser light irradiation is performed by shifting the position of scanning with the linear laser light in the long side direction by the width of the crystal region obtained by scanning with linear laser light at a time.

Figure 6:
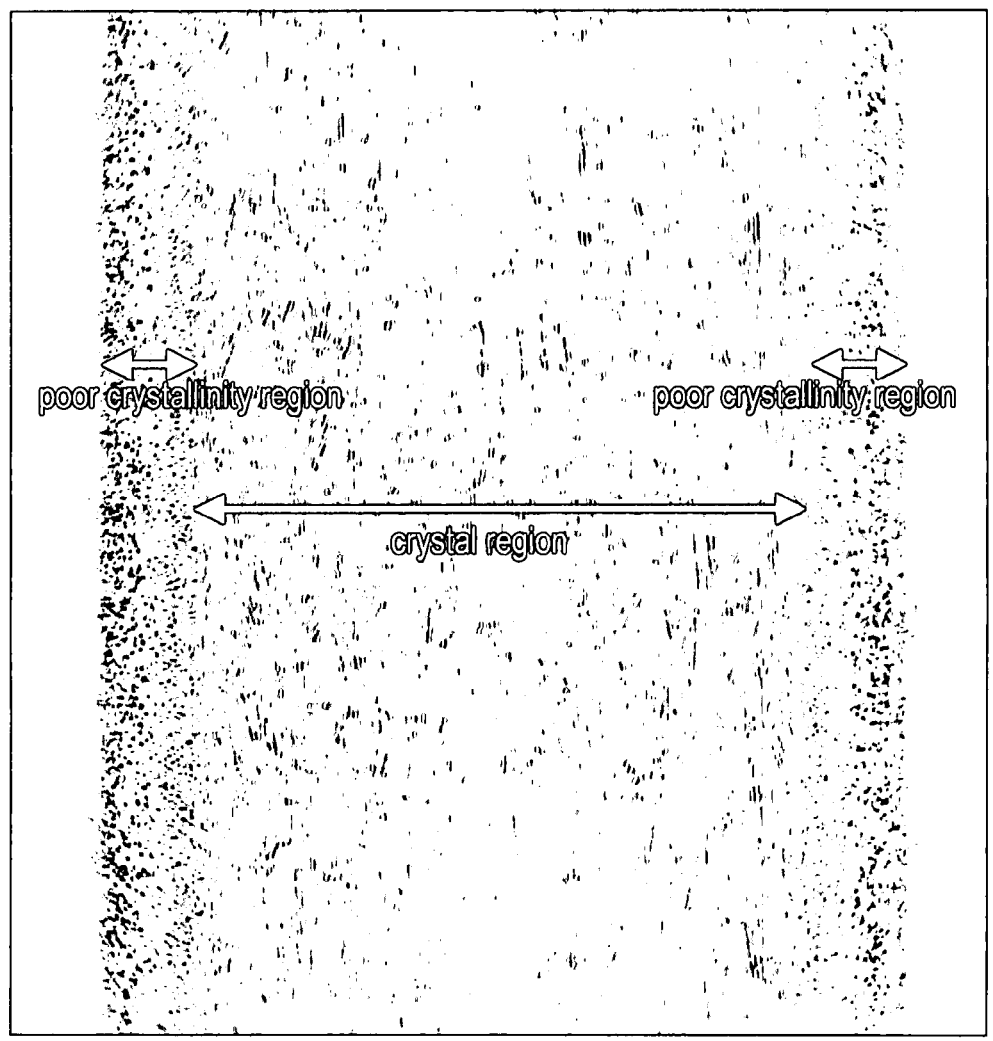
FIG. 6 is a diagram showing an image of a surface of a semiconductor film having been irradiated with laser light.

On the other hand, there are cases where poor crystallinity regions are formed at each end of the linear laser light in the long side direction due to energy attenuation at the same time as the formation of the crystal region. FIG. 6 shows an image of a surface of the semiconductor film after crystallization by irradiating the semiconductor film formed over the substrate with the linear laser light. In FIG. 6, regions which are not crystallized efficiently due to energy attenuation (poor crystallinity region) are observed at each end of the crystal region in the semiconductor film which has been irradiated with laser light. Further, irregularities are seen to be formed in the surface of the semiconductor film at the poor crystallinity region.

Thus, when the semiconductor film is crystallized by scanning with linear laser light a plurality of times, crystal regions are sequentially formed in the scan direction of the laser light; however, in the direction orthogonal to the scan direction, poor crystallinity region is formed between crystal regions in the semiconductor film. In the poor crystallinity region, irregularities are formed in the surface of the semiconductor film. Thus, the planarity is not sufficient, and therefore, when a thin film transistor, a capacitor element, or the like is manufactured using the poor crystallinity region of a semiconductor film, the irregularities may cause variation in electrical characteristics or malfunction.

Therefore, in a semiconductor device described in this embodiment mode, transistors, capacitor elements, and the like are formed by using parts of the semiconductor thin film avoiding the poor crystallinity regions. That is, the layout of the circuits and the capacitor portion is determined so that transistors included in the above-described circuits and capacitor elements included in the capacitor portion can be formed using regions with grains having large grain sizes in a semiconductor film, which is obtained by laser annealing. Normally, since the scan direction of laser light and the width of the region with grains having large grain sizes are predetermined, the circuits are arranged so that the thin film transistors are provided corresponding to the width. Specifically, the width of the region with grains having large grain sizes ranges from approximately 200 μm to 1500 μm, although depending on the energy of laser used for the irradiation. Therefore, the semiconductor thin film used for the thin film transistors and the like is provided in this range. On the other hand, in the case where regions with grains having large grain sizes is formed by plural times of laser light scanning, a poor crystallinity region having a width of approximately 3 μm to 10 μm is formed between a region with grains having large grain sizes by n-th laser light scanning and a region with grains having large grain sizes obtained by n+1-th laser light scanning; therefore, the semiconductor thin film is provided so as not to include the poor crystallinity region.

Further, as semiconductor devices are being miniatured, it is necessary to provide a capacitor portion so as to obtain high capacitance in a limited space. Meanwhile, because semiconductor films forming the capacitor elements are necessarily provided to be flat, the capacitor elements are necessarily provided in regions avoiding a poor crystallinity region. When capacitor elements are formed, large capacitance can be obtained by providing a thin insulating film between electrodes. However, there is a high risk of short circuit when a thin insulating film is formed on an electrode (for example, semiconductor film) having poor planarity.

Therefore, in the capacitor portion which forms a semiconductor device shown in this embodiment mode, a semiconductor film included in the capacitor element is provided so as not to include the poor crystallinity region. Further, in order to obtain as higher capacitance as possible in a limited area, lead wiring or the like other than the semiconductor film is placed in the poor crystallinity region, and capacitor elements are provided as a plurality of divided blocks so that capacitor elements are densely arranged in the region with grains having large grain sizes. Here, each of the plurality of blocks has a plurality of capacitor elements. A block refers to a group (cluster) in which the plurality of capacitor elements are provided.

Figure 4:
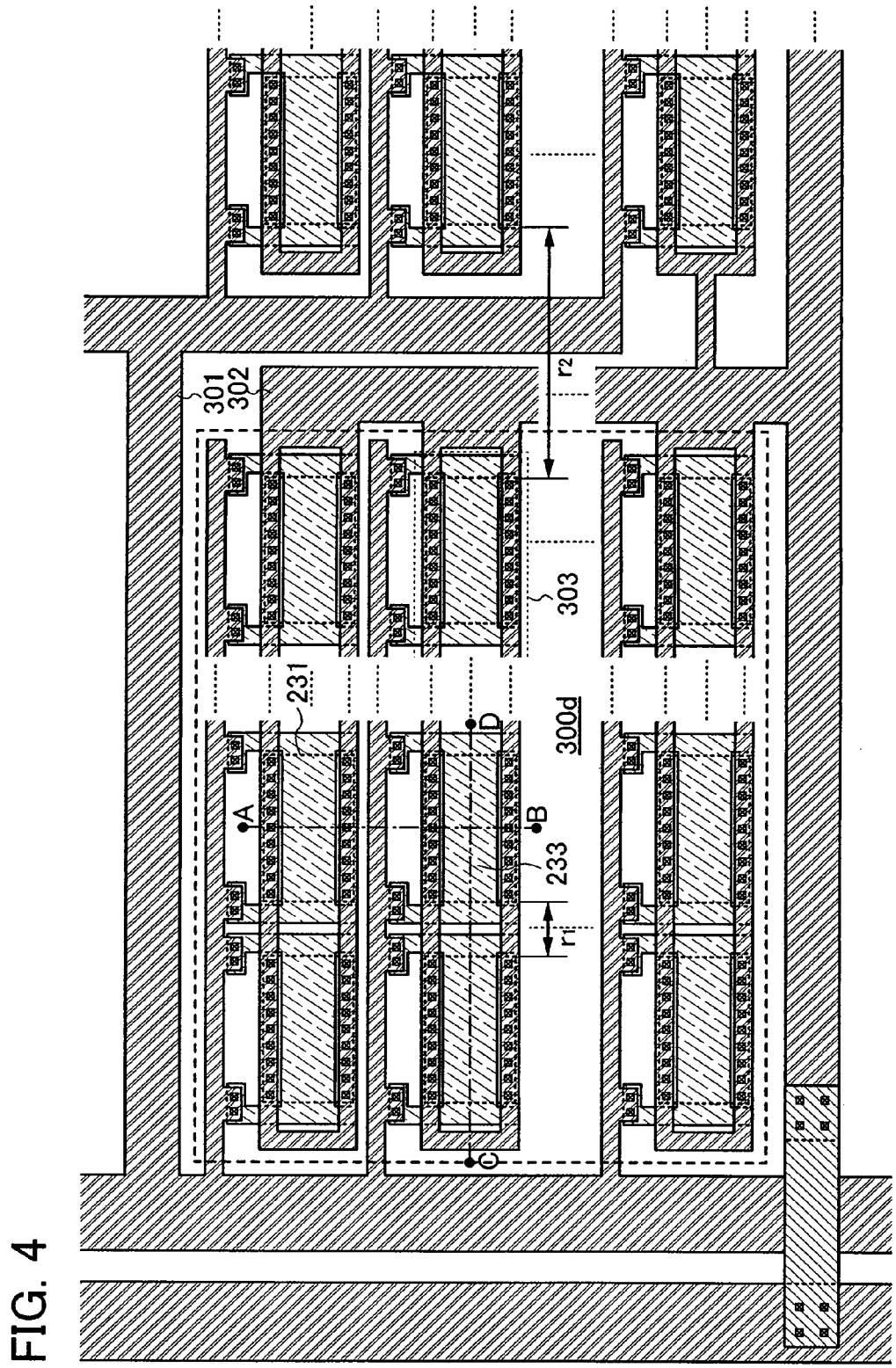
FIG. 4 is a diagram showing an example of capacitor portions in a semiconductor device of the present invention.
Figure 5A:
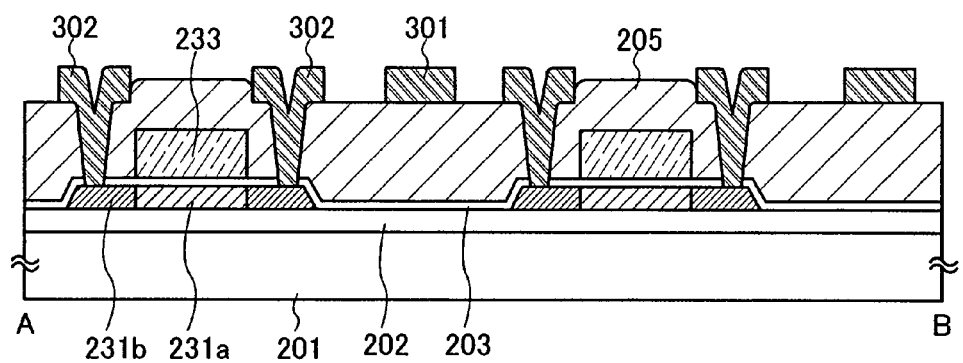
FIGS. 5A and 5B are diagrams showing examples of capacitor portions in a semiconductor device in the present invention.
Figure 5B:
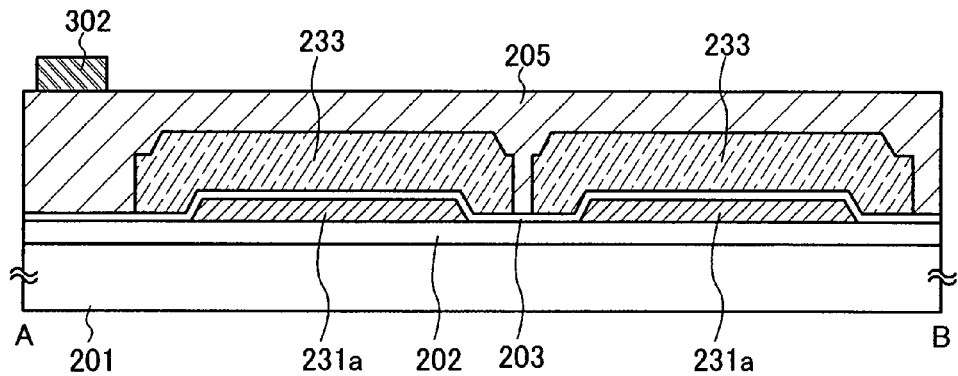

Next, an example of a capacitor portion of the present invention will be described with reference to drawings. FIG. 5A shows a cross-sectional view taken along line A-B in FIG. 4, and FIG. 5B shows a cross-sectional view taken along line C-D in FIG. 4.

Figure 3:
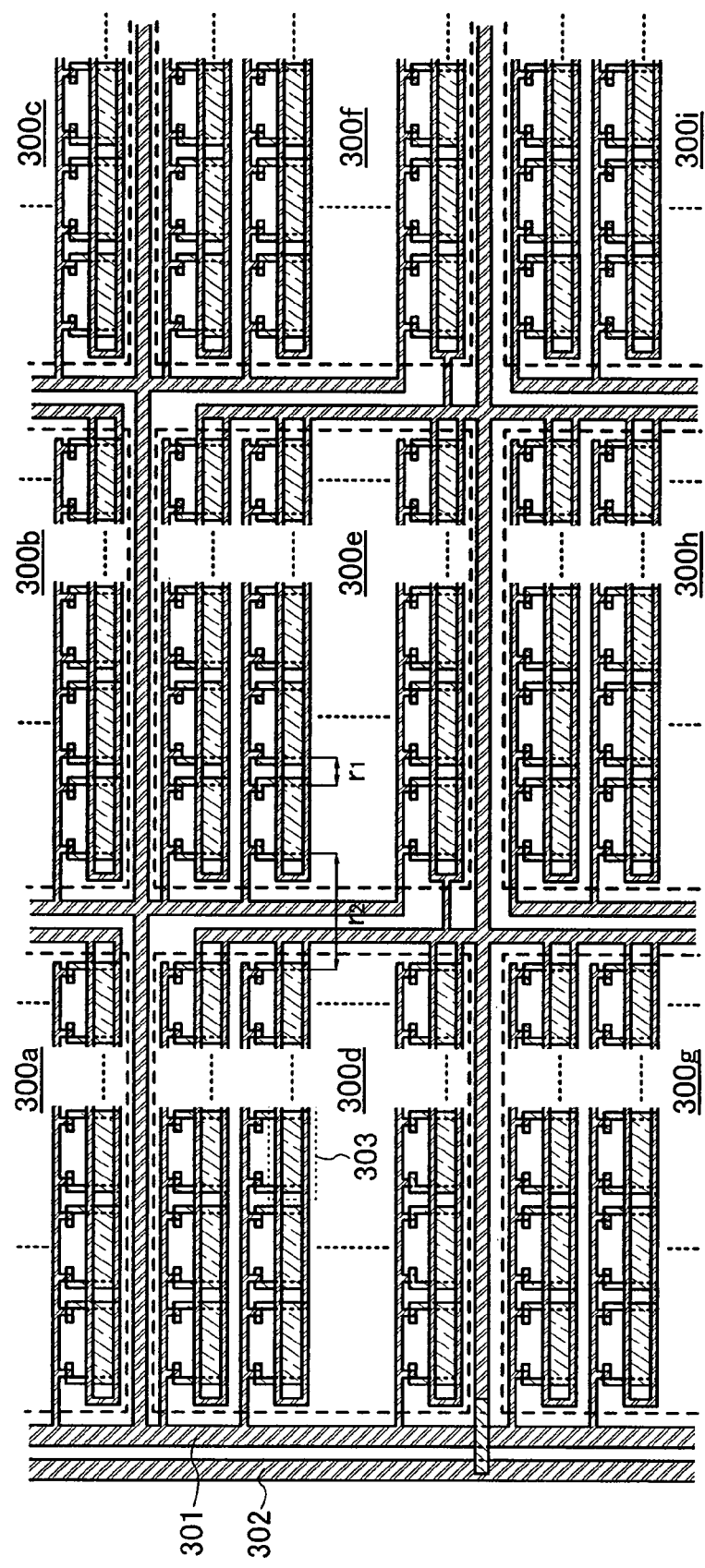
FIG. 3 is a diagram showing an example of capacitor portions in a semiconductor device of the present invention.

A capacitor portion shown in this embodiment mode includes a first wiring 301, a second wiring 302, and a plurality of capacitor elements 303. Further, the plurality of capacitor elements 303 are divided and provided as a plurality of blocks 300a to 300i. That is, each of the blocks 300a to 300i has the plurality of capacitor elements 303 (see FIG. 3). Here, in each block, a plurality of semiconductor films are provided in the form of islands to provide the plurality of capacitor elements. This is because in the case where the area of the capacitor element is large and the resistance of the semiconductor film is large, capacitance sufficient for the area of the semiconductor cannot be obtained.

Each of the plurality of capacitor elements 303 provided in each block includes at least the semiconductor film 231 provided with the first impurity region 231a and the second impurity regions 231b provided apart with the first impurity region 231a interposed therebetween, and the conductive film 233 provided over the semiconductor film 231 with the insulating film 203 therebetween. Further, in the capacitor element 303, a capacitor is formed with the semiconductor film 231, the insulating film 203, and the conductive film 233 (see FIG. 4 and FIGS. 5A and 5B).

The conductive film 233 in the capacitor element 303 is electrically connected to the first wiring 301, and the second impurity regions 231b in the semiconductor film 231 are electrically connected to the second wiring 302. Further, the conductive films 233 in the plurality of capacitor elements are electrically connected to each other through the first wiring 301. That is, the conductive films 233 of the plurality of capacitor elements are individually provided and electrically connected through the first wiring. Further, the plurality of second impurity regions 231b provided in the plurality of capacitor elements are electrically connected to each other through the second wiring 302. The plurality of capacitor elements are provided so as to connect in parallel to each other.

Further, the capacitor portions shown in this embodiment mode are provided so that the distance $r_1$ between adjacent semiconductor films provided in capacitor elements and the shortest distance $r_2$ between semiconductor films provided in capacitor elements in different adjacent blocks satisfy $r_1<r_2$. Here, the distance between the adjacent blocks means the shortest distance between the semiconductor films included in different blocks.

The distance between the semiconductor films here refers to a distance between the semiconductor films in the direction orthogonal to the scan direction of laser light. That is because the poor crystallinity regions between the regions with grains having large grain sizes are formed along the scan direction of the laser light. Therefore, in this embodiment mode, the distance $r_2$ is preferably larger than the width of the poor crystallinity region formed by laser light irradiation. That is because the surface of the semiconductor film in the poor crystallinity region is not sufficiently flat, and there are risks of short-circuits and the like in the case where the semiconductor film in the poor crystallinity region is used for forming the capacitor element. The distance $r_2$ is preferably from 20 μm to 200 μm, more preferably from 50 μm to 100 μm. This is because the poor crystallinity region is formed to have a width of from 3 μm to 10 μm, and the distance $r_2$ is preferably provided to be a little larger than the width of a poor crystallinity region considering the process width, besides, in the case where the distance $r_2$ is excessively large, the area to be provided with the capacitor elements is reduced, and sufficient capacitance cannot be ensured.

Further, here, the capacitor elements are divided and provided also in the scan direction of laser light considering the wiring resistance and the like, and lead wiring and the like are provided between the blocks. However, in the case where the wiring resistance or the like have little effect, the regions with grains having large grain sizes are sequentially formed in the scan direction of laser light; therefore, a structure in which the capacitor elements are provided without being divided into blocks is also available.

Further, the capacitor element 303 is preferably provided in the same steps as the thin film transistor for simplifying the manufacturing process. For example, it is preferable to use the gate insulating film of the thin film transistors as the insulating film 203 of the capacitor elements 303. In particular, when the gate insulating film is formed thinly, the capacitor elements 303 can have higher capacitance.

Further, the second impurity regions 231b of the semiconductor film 231 are preferably formed by introducing impurity element at high concentration at the same time as regions serving as the source regions or the drain regions of the thin film transistors. The first impurity region 231a of the semiconductor film 231 may be provided by introducing impurity element at high concentration similarly to the second impurity regions 231b; however, there is a risk of damage to the insulating film 203 when the impurity element is introduced at high concentration. Accordingly, the first impurity region 231a is preferably formed by introducing impurity element at lower concentration than the second impurity regions. In other words, in this embodiment mode, the concentration of the impurity element contained in the first impurity region 231a is set lower than the concentration of the impurity element contained in the second impurity regions 231b. In this embodiment mode, it is very advantageous to reduce a damage done to the insulating film 203 when the first impurity region 231a is formed considering that the plurality of capacitor elements are provided in parallel or that the insulating film 203 having a thin film thickness is used.

Further, in this embodiment mode, the plurality of capacitor elements 303 provided in the blocks 300a to 300i are connected in parallel. Thus, more capacitance can be obtained by connecting the plurality of capacitor elements in parallel. In the case where the plurality of capacitor elements are connected in parallel, reliability is concerned; however, in this embodiment mode, the semiconductor film 231 of the capacitor element 303 is provided in a region with grains having large grain sizes, which has high planarity so as to avoid the poor crystallinity region where irregularities are formed, and besides, when the first impurity region 231a is formed in the semiconductor film 231, impurity element is introduced at lower concentration than the impurity element introduced into the second impurity regions thereby reducing the damage done to the insulating film 203 to the minimum. Thus, the reliability by of the semiconductor device is improved.

Further, the conductive film 233 of the capacitor element 303 can be formed simultaneously with the formation of gate electrodes of thin film transistors forming circuits, which is preferable because it leads to simplicity of manufacturing. Further, in this case, in the plurality of capacitor elements 303, the conductive films 233 may be provided to be shared by adjacent capacitor elements; however, the conductive films 233 provided respectively in the plurality of capacitor elements may be connected through the wiring 301 as described above using a material having lower resistance than the conductive film 233, thereby the wiring resistance can be reduced and power consumption can be reduced.

Figure 11:
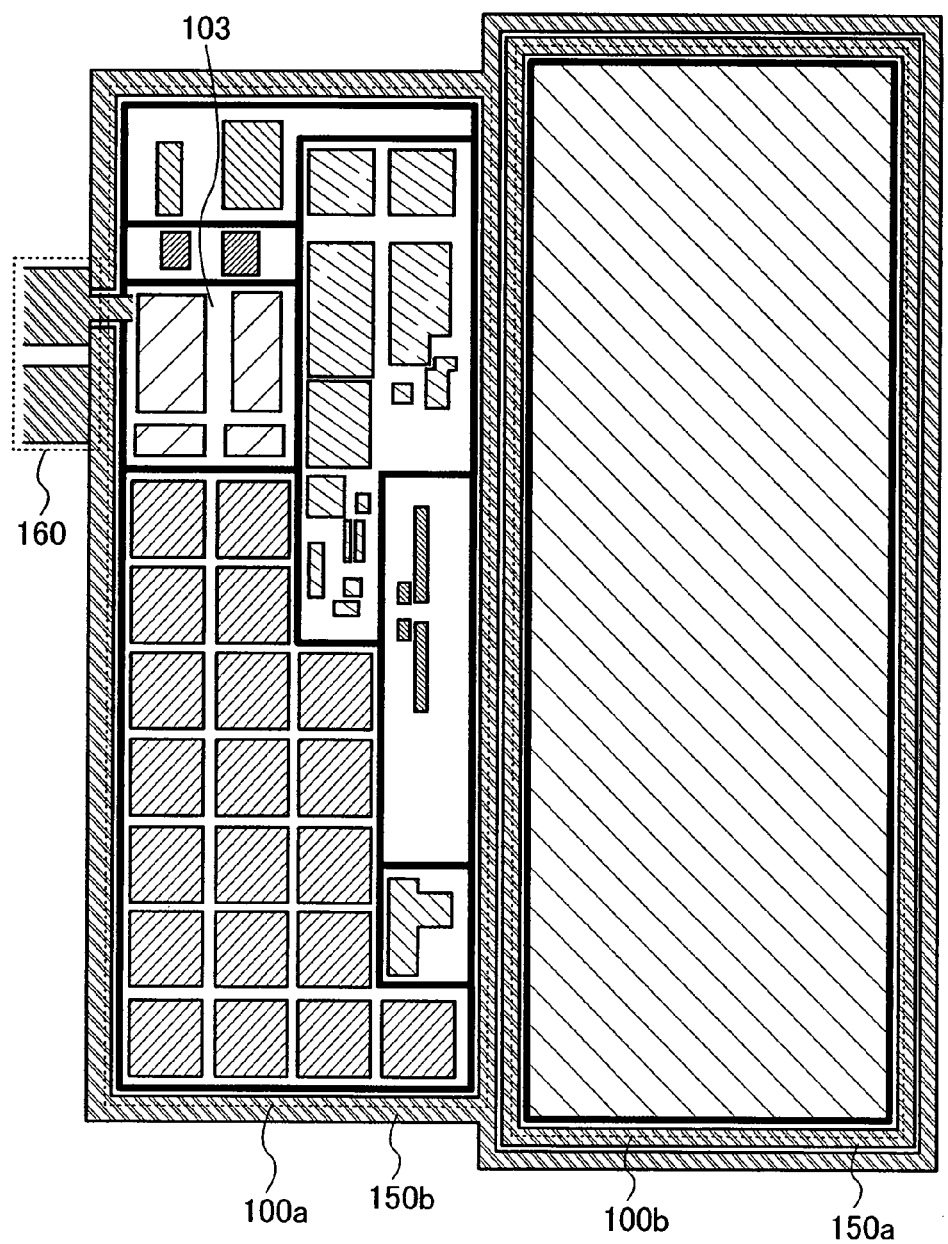
FIG. 11 is a diagram showing an example of a semiconductor device of the present invention.

Further, the semiconductor device shown in this embodiment mode may have a structure in which wiring is provided so as to surround the analog circuit and the digital circuit which are provided separately. Thus, when the wiring is provided so as to surround the analog circuit and the digital circuit, wiring resistance of the circuits in the semiconductor device can be reduced thereby controlling the effect of noise. Further, here, wiring 150a supplying higher supply voltage (VDD) and a wiring 150b supplying lower supply voltage (VSS) are provided so as to surround the digital circuit portion 100b (see FIG. 11). Meanwhile, wiring 150a supplying lower supply voltage (VSS) is provided so as to surround the analog circuit portion 100a, and wiring 150b which can functions as ground wiring is not provided to surround the analog circuit portion 100a. The lower supply voltage (or less, VSS) can be GND.

Further, in the case where a radio-frequency signal received with an antenna is inputted into the circuits through wiring, loss of the radio frequency signal is increased by reflection of the signal or signal leakage to a space due to stretch or warpage of wiring. Therefore, regarding the semiconductor device shown in this embodiment mode, the length of the wiring through which the radio frequency signal transmits is shortened and the wiring is straightened, so that the rectification circuit 103 receiving the radio frequency signal is arranged in the vicinity of the antenna connection portion 160. With such a configuration, loss of radio frequency signal transmitted through the wiring can be reduced.

Thus, by forming circuits and capacitor elements with using a semiconductor film of a region with grains having large grain sizes, formed by laser light irradiation, thin film transistors having high mobility can be manufactured, and capacitor elements having high reliability and great capacity can be obtained; thus, higher signal processing speed is realized and a certain communication distance can be ensured.

This embodiment mode can be freely combined with any other embodiment modes of the specification.

Embodiment Mode 2

This embodiment mode will describe an example of a method for manufacturing a semiconductor device of the present invention with reference to drawings.

First, a semiconductor film 403 is formed over a substrate 401 with an insulating film 402 therebetween. Further, regions with grains having large grain sizes, 403a are formed in the semiconductor film 403 by irradiating the semiconductor film 403 with laser light (FIG. 7A). Poor crystallinity regions 403b are formed at end portions of the regions with grains having large grain sizes, 403a.

The substrate 401 is selected from a glass substrate, a quartz substrate, a metal substrate (for example, a stainless-steel substrate or the like), a ceramic substrate, a semiconductor substrate such as a Si substrate, and the like. Alternatively, a plastic substrate such as a substrate of polyethylene terephthalate (PET), polyethylene naphthalate (PEN), polyethersulfone (PES), or acrylic can be selected.

The insulating film 402 is formed by CVD, sputtering, or the like using silicon oxide, silicon nitride, silicon oxynitride ($SiO_xN_y$) (x>y>0), silicon nitride oxide ($SiN_xO_y$) (x>y>0), or the like. For example, in the case where the insulating film 402 has a two-layer structure, a silicon nitride oxide film may be formed as a first layer insulating film, and the silicon oxynitride film may be formed as a second layer insulating film. Alternatively, a silicon nitride film may be formed as the first layer insulating film, and a silicon oxide film may be formed as a second layer insulating film. Thus, an insulating film 402 serving as a blocking layer is formed, thereby an alkali metal such as Na or an alkaline earth metal from the substrate 401 can be prevented from adversely affecting elements formed over the substrate 401. When quartz is used for the substrate 401, the insulating film 402 may be omitted.

The semiconductor film 403 is formed by CVD or the like using an amorphous semiconductor film of silicon or the like.

Further, when the semiconductor film is crystallized by laser light irradiation, an LD-pumped continuous wave (CW) laser ($YVO_4$, second harmonic (wavelength: 532 nm)) can be used as a laser light source. The wavelength is not necessarily limited to the second harmonic; however, the second harmonic is superior to other higher harmonics in point of energy efficiency. When a semiconductor film is irradiated with CW laser light, the semiconductor film continuously receives energy; therefore, once the semiconductor film is melted, the melted state can continue. Moreover, it is possible to move a solid-liquid interface of the semiconductor film by scanning with CW laser light and to form a crystal grain extending in one direction along this moving direction. A solid-state laser is used because its output is so stable that a stable process can be expected as compared with a gas laser or the like. Not only a CW laser but also a pulsed laser with a repetition rate of 10 MHz or more can be used. In a case of using a pulsed laser with high repetition rate, when the pulse interval is shorter than the period after the semiconductor film is melted and before the melted semiconductor film is solidified, the semiconductor film can continuously remain in a melting state. Then, by moving the solid-liquid interface, the semiconductor film including a crystal extending in one direction can be formed. Another CW laser or pulsed laser with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. A YAG laser, a $Y_2O_3$ laser, a $GdVO_4$ laser, a $YVO_4$ laser, and the like are also called ceramic lasers. As a metal vapor laser, a helium-cadmium laser or the like is given. Moreover, oscillation of laser light with $TEM_{00}$ (single transverse mode) in a laser oscillator is preferable because the energy homogeneity of a linear beam spot on an irradiation surface can be improved. In addition, a pulsed excimer laser may be used.

In order to control a threshold voltage or the like of the semiconductor film 403, an impurity element may be introduced, in advance, into the semiconductor film 403 at low concentration. In this case, the impurity element is introduced into a region which later serves as a channel forming region in the semiconductor film 403. As the impurity element, an impurity element imparting an n-type conductivity or an impurity element imparting a p-type conductivity can be used. As the impurity element imparting an n-type conductivity, phosphorus (P), arsenic (As), or the like can be used. As the impurity element imparting a p-type conductivity, boron (B), aluminum (Al), gallium (Ga), or the like can be used. For example, as the impurity element, boron (B) is introduced into the entire surface of the semiconductor film 403 in advance so that boron is contained at a concentration of $5 \times 10^{15}$ atoms/$cm^3$ to $5 \times 10^{17}$ atoms/$cm^3$.

Next, a semiconductor film 403 is selectively etched to form island-shaped semiconductor films 404a to 404d and 405a to 405d (FIG. 7B). Here, the poor crystallinity region 403b in the semiconductor film 403 is selectively removed and island-shaped semiconductor films using the regions with grains having large grain sizes, in the semiconductor film 403. The semiconductor films 404a to 404d form thin film transistors to be later formed, and the semiconductor films 405a to 405d form capacitor elements to be formed later. Further, there shall arise gaps corresponding to the poor crystallinity regions between the semiconductor film 404b and the semiconductor film 404c and between the semiconductor film 405b and the semiconductor film 405c.

Next, after an insulating film 406 is formed so as to cover the island-shaped semiconductor films 404a to 404d and 405a to 405d, an impurity element is selectively introduced into the semiconductor films 405a to 405d for forming impurity regions 407 (FIG. 7C). The insulating film 406 formed over the semiconductor films 404a to 404d function as gate insulating films in thin film transistors, and the insulating film 406 over the semiconductor films 405a to 405d function as a dielectric layer of capacitor elements.

An impurity element imparting n-type conductivity or an impurity element imparting p-type conductivity can be used as the impurity element. As the impurity element imparting n-type conductivity, phosphorus (P), arsenic (As), or the like can be used. As the impurity element imparting p-type conductivity, boron (B), aluminum (Al), gallium (Ga), or the like can be used.

Further, the semiconductor films 405a to 405d function as electrodes of the capacitor elements. Therefore, it is preferable to introduce an impurity element to increase conductivity of the semiconductor films 405a to 405d. However, the insulating film 406 is damaged when an impurity element is introduced at high concentration, which involves a risk of short circuits in the capacitor elements. Accordingly, when an impurity element is introduced, it is preferable to perform the introduction so that the insulating film 406 is not damaged. For example, the n-type impurity regions 407 are formed by introducing phosphorus (P) into the semiconductor films 405a to 405d.

Next, conductive films 408a to 408d are selectively formed over the semiconductor films 404a to 404d, and conductive films 409a to 409d are formed over the semiconductor films 405a to 405d, with the insulating film 406 therebetween. Here, the conductive films 408a to 408d are formed over the semiconductor films 404a to 404d respectively, and the conductive films 409a to 409d are formed over the semiconductor film 405a to 405d respectively. After that, an impurity element is introduced into the semiconductor films 404a to 404d using the conductive films 408a to 408d as masks to form impurity regions 410. Then, the semiconductor films 404b and 404d and the semiconductor films 405a to 405d are selectively covered with resist and an impurity element is introduced into the semiconductor films 404a and 404c using the conductive films 408a and 408c as masks. Consequently, the channel formation region and the impurity regions 411b each serving as a source region or a drain region are formed in each of the semiconductor films 404a and 404c (FIG. 7D).

Further, the impurity regions 411b each serving as a source region or a drain region in the semiconductor film 404a and 404c are spaced apart with the channel formation region 411a interposed therebetween.

The conductive films 408a to 408d and conductive films 409a to 409d can be formed using an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main component. In addition, a metal nitride film obtained by nitriding such an element can be used. Alternatively, the conductive films can be formed using a semiconductor material typified by polycrystalline silicon doped with an impurity element such as phosphorus. Here, the conductive films 408a to 408d and the conductive films 409a to 409d are formed in a layered structure in which tantalum nitride and tungsten are stacked sequentially.

As the impurity element, an impurity element imparting n-type conductivity or an impurity element imparting p-type conductivity can be used. As the n-type impurity element, phosphorus (P), arsenic (As), or the like can be used. As the p-type impurity element, boron (B), aluminum (Al), gallium (Ga), or the like can be used. Here, the impurity region 410, which has n-type conductivity is formed by introducing phosphorus (P), and impurity region 411b, which has p-type conductivity is formed by introducing boron (B).

Next, insulating films 412a to 412d and insulating films 413a to 413d are formed so as to be in contact with side surfaces of the conductive films 408a to 408d and the conductive films 409a to 409d (FIG. 8A). The insulating films 412a to 412d and the insulating films 413a to 413d are also referred to as sidewalls.

As a method for manufacturing the insulating films 412a to 412d and the insulating films 413a to 413d, first, a single layer or a stack of an insulating films including an inorganic material such as silicon, oxide of silicon, or nitride of silicon or an insulating film containing an organic material of an organic region or the like by plasma CVD, sputtering, or the like so as to cover the insulating film 406. Next, those insulating films are selectively etched by anisotropic etching mainly in the vertical direction to form insulating films in contact with the surfaces of the conductive films 408a to 408d and the conductive films 409a to 409d. There are cases where part of the insulating film 406 is etched away at the same time as the formation of the insulating films 412a to 412d and the insulating films 413a to 413d (see FIG. 8A). In the case where part of the insulating film 406 is removed, remaining parts of the insulating film 406 are formed below the conductive films 408a to 408d, the conductive films 409a to 409d, the insulating films 412a to 412d, and the insulating films 413a to 413d.

Next, the semiconductor films 404a and 404c are selectively covered with resist, and an impurity element is introduced into the semiconductor films 404b and 404d and the semiconductor films 405a to 405d using the conductive films 408b and 408d, the conductive films 409a to 409d, the insulating films 412b and 412d, and the insulating films 413a to 413d as masks. As a result, the channel formation region 414a, the impurity regions 414b each serving as a source region or a drain region, impurity regions 414c serving as LDD regions are formed in the semiconductor films 404b and 404d. Further, first impurity regions 415a, and second impurity regions 415b are formed in the semiconductor films 405a to 405d (FIG. 8B).

In the semiconductor films 404b and 404d, the impurity regions 414b each serving as a source region or a drain region are spaced apart with the channel formation region 414a interposed therebetween, and the impurity regions 414c serving as LDD regions are spaced apart with the channel formation region 414a interposed therebetween, and the impurity regions 414c serving as LDD regions are formed below the insulating films 412b and 412d between the channel formation region 414a and the impurity regions 414b each serving as a source region or a drain region. Further, in the semiconductor films 405a to 405d, the second impurity regions 415b are spaced apart with the first impurity region 415a interposed therebetween.

As the impurity element, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is introduced to form the impurity regions 414b and 414c and the impurity regions 415a and 415b which have n-type conductivity. In this embodiment mode, introduction is performed so that the impurity regions 414b and 414c and the second impurity regions 415b contain the impurity element of higher concentration than the first impurity region 415a.

Next, an insulating film 416 is formed so as to cover the semiconductor films 404a to 404d, the semiconductor films 405a to 405d, the conductive films 408a to 408d, the conductive films 409a to 409d (FIG. 8C).

The insulating film 416 can be provided by forming an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as DLC (diamond-like carbon); an organic material such as epoxy, polyimide, polyamide, polyvinyl phenol, benzocyclobutene, or acrylic; a siloxane material such as siloxane, in a single layer structure or a layered structure, by CVD, sputtering, or the like. The siloxane material is a material having a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. In addition, as a substituent, both a fluoro group and an organic group containing at least hydrogen may also be used.

Next, an insulating film 417 is formed so as to cover the insulating film 416, and conductive films 418a to 425a and 418b to 425b are formed over the insulating film 417 (FIG. 8D).

Here, the conductive films 418a and 418b are provided so as to electrically connect to the impurity regions 411b each serving as a source region or a drain region in the semiconductor film 404a. Similarly, the conductive films 419a and 419b are provided so as to electrically connect to the impurity regions 414b in the semiconductor film 404b; the conductive films 420a and 420b to the impurity regions 411b in the semiconductor film 404c; and the conductive films 421a and 421b to the impurity regions 414b in the semiconductor film 404d. The conductive films 422a and 422b are provided so as to electrically connect the second impurity regions 415b in the semiconductor film 405a. Similarly, the conductive films 423a and 423b are provided so as to electrically connect to the second impurity regions 415b in the semiconductor film 405b; the conductive films 424a and 424b to the second impurity regions 415b in the semiconductor film 405c; and the conductive films 425a and 425b to the second impurity regions 415b in the semiconductor film 405d.

Further, the conductive film 422a and the conductive film 422b are electrically connected to each other on the insulating film 417. The conductive films 422a to 425a are electrically connected to the conductive films 422b to 425b, respectively.

The insulating film 417 can be provided by forming an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as DLC (diamond-like carbon); an organic material such as epoxy, polyimide, polyamide, polyvinyl phenol, benzocyclobutene, or acrylic; a siloxane material such as siloxane, in a single layer structure or a layered structure, by CVD, sputtering, or the like. In this embodiment mode, heat treatment is performed to activate the semiconductor films 404a to 404d and the semiconductor films 405a to 405d after forming the insulating film 416, and the insulating film 417 is formed after that.

The conductive films 418a to 425a and 418b to 425b are formed by CVD, sputtering, or the like using an element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above element as its main component with a single layer structure or a layered structure. An alloy material containing aluminum as its main component corresponds to, for example, an alloy material containing aluminum as a main component and nickel, or an alloy material containing aluminum as a main component, nickel and one or both of carbon and silicon. As the conductive films 418a to 425a and 418b to 425b, it is preferable in this embodiment mode to employ, for example, a layered structure of a barrier film, an aluminum-silicon (Al—Si) film, and a barrier film, or a layered structure of a barrier film, an aluminum-silicon (Al—Si) film, a titanium nitride (TiN) film, and a barrier film. It is to be noted that the barrier film preferably corresponds to a thin film formed using titanium, a nitride of titanium, molybdenum, or a nitride of molybdenum. Aluminum and aluminum silicon which have low resistance and are inexpensive are optimal materials for forming the conductive films 418a to 425a and 418b to 425b. In addition, generation of a hillock of aluminum or aluminum silicon can be prevented when upper and lower barrier layers are provided. Further, when the barrier film is formed using titanium that is a highly reducible element, even if a thin natural oxide film is formed on the crystalline semiconductor layer, the natural oxide film is reduced so that preferable contact with the crystalline semiconductor layer can be obtained.

Through the above steps, the semiconductor device can be manufactured. Further, the structure of the thin film transistors can use a variety of modes. The structure is not limited to a certain structure. For example, a multigate structure with two or more gate electrodes may be employed. With the multigate structure, off-state current is reduced, withstand voltage is improved, or change in current between a drain and a source can be reduced even when voltage between the drain and the source are changed while operated in a saturation region. In addition, an LDD region may be provided not only in an n-channel thin film transistor but also in a p-channel thin film transistor. When an LDD region is provided, off-state current is reduced, withstand voltage is improved, or change in current between a drain and a source can be reduced even when voltage between the drain and the source are changed while operated in a saturation region.

This embodiment mode can be freely combined with any other embodiment modes of the specification.

Embodiment Mode 3

In this embodiment mode, an example of a semiconductor device of the present invention will be described with reference to drawings. Specifically, a semiconductor device provided with a PLL (Phase Locked Loop) circuit portion will be described with reference to drawings.

FIG. 9 is a block diagram showing one exemplary configuration of a semiconductor device which can perform transmission/reception of instructions or data with radio signals. This semiconductor device includes an antenna portion 902, an RF circuit portion 903, a power supply circuit portion 905, and a logic circuit portion 907. The antenna portion 902 communicates signals with a communication device which is also called a reader/writer. Frequencies of carrier waves for delivering signals can be LF bands (1 to 135 kHz), HF bands (6.78 MHz, 13.56 MHz, 27.125 MHz, 40.68 MHz, or 5.0 MHz), microwave bands (2.45 GHz, 5.8 GHz, or 24.125 GHz), or the like. The antenna portion 902 can have either a coiled shape, monopole shape, or dipole shape depending on the communication frequency.

Carrier waves that the antenna portion 902 has received are divided into the power supply circuit portion 905 and the logic circuit portion 907 through a detection capacitor portion 904. In the power supply circuit portion 905, the carrier waves are half-wave rectified by a rectifier circuit portion 910, and then charged in a storage capacitor portion 912. A constant voltage circuit portion 914 outputs a constant voltage even if it has received power of more than a certain level relative to the power of the carrier waves received, and supplies power which is necessary to operate the logic circuit portion 907 or the like within the semiconductor device.

A demodulation circuit portion 908 in the RF circuit portion 903 demodulates the carrier waves to generate clock signals that are necessary to operate the logic circuit portion 907, and outputs the clock signals to a PLL circuit portion 918 which has a function of correcting the clock signals and to a code recognition/judgment circuit portion 916. For example, the demodulation circuit portion 908 detects an amplitude fluctuation of "0" or "1" as reception data from an ASK (Amplitude Shift Keying) modulated reception signal. The demodulation circuit portion 908 includes a low-pass filter, for example. In addition, a modulation circuit portion 906 transmits transmission data as an ASK modulated transmission signal.

The code recognition/judgment circuit portion 916 recognizes and judges instruction codes. Instruction codes that are recognized and judged by the code recognition/judgment circuit portion 916 include an EOF signal (End Of Frame), an SOF signal (Start Of Frame), a flag, a command code, a mask length, a mask value, and the like. The code recognition/judgment circuit portion 916 also includes a cyclic redundancy check (CRC) function for discriminating send errors. A judgment result by the code recognition/judgment circuit portion 916 is output to a memory controller portion 920. The memory controller portion 920 controls data reading from a memory portion 922 based on the judgment result. Data which is read out from the memory portion 922 is encoded by an encoding circuit portion 924. Then, the modulation circuit portion 906 modulates the encoded data, thereby a response signal is generated.

The memory portion 922 may include a mask ROM (Read Only Memory) which stores only fixed data, a memory which can be read and written at arbitrary timing such as an SRAM (Static Random Access Memory), a nonvolatile memory which has a floating electrode for accumulating electric charges, and the like.

In this manner, the semiconductor device shown in FIG. 9 has a function of writing data to or reading data from the memory portion 922 by receiving instructions from a communication device which is also called a reader/writer.

An example of a layout of circuits in a semiconductor device which has the above configuration and function will be described below.

In the above circuits, the PLL circuit portion 918 is used as a circuit which generates a clock signal of a frequency synchronized with a signal supplied, among various kinds of circuits integrated on one substrate. The PLL circuit portion 918 has a voltage controlled oscillator circuit (hereinafter, a VCO circuit) and compares the phase of a supplied signal with that of a feedback signal which is made from an output of the VCO circuit. Then, the PLL circuit portion 918 adjusts an output signal by negative feedback so that the supplied signal and the feedback signal are the same.

However, there are cases where the PLL circuit portion 918 is affected by manufacturing conditions of a process or the like and an output signal having a desired frequency cannot be obtained. Therefore, in the semiconductor device of this embodiment mode, circuits in correlation with the PLL circuit portion 918 are provided adjacent to the PLL circuit portion 918. Here, the PLL circuit portion 918 and the constant voltage circuit portion 914 are provided adjacent to each other, so that operation of the PLL circuit portion 918 can be stabilized. Further, a semiconductor films forming the PLL circuit portion 918 and the constant voltage circuit portion 914 is disposed in a region of a crystalline semiconductor film obtained by scanning at a time; thus, effect of a process can be reduced, and the operation of the PLL circuit portion 918 can be improved more effectively.

When productivity and cost are considered, it is more preferable to form such a semiconductor device made from thin film transistors over an insulating substrate such as glass than that made from MOS transistors using a single crystalline silicon substrate.

That is, in order to spread such a semiconductor device which is capable of wireless data transmission/reception throughout society, it is vital to lower the manufacturing cost. However, building a new production line using a manufacturing technique of semiconductor integrated circuits involves a large amount of equipment investment, and thus a cost reduction is difficult to achieve. For example, building a production line for 12-inch wafers requires an equipment investment of approximately 150 billion yen. Furthermore, considering a running cost, it is quite difficult to suppress the unit cost down to 100 yen or less. A 12-inch wafer has an area of approximately 73000 mm$^2$. Therefore, even when neglecting a width of approximately 100 μm which is necessary for cutting the wafer with a dicing machine having a blade with a width of approximately 20 to 50 μm, only 73000 chips with a size of 1 mm×1 mm or 182500 chips with a size of 0.4 mm×0.4 mm can be obtained. Therefore, it is very difficult to secure sufficient supply quantities. Meanwhile, in the case of manufacturing the semiconductor device from thin film transistors over an insulating substrate such as glass as described above, a large-area substrate can be used compared with a case of using a single crystalline silicon substrate. Accordingly, more chips can be manufactured from one substrate.

This embodiment mode can be freely combined with any other embodiment modes of the specification.

Embodiment Mode 4

In this embodiment mode, examples of usage patterns of semiconductor devices of the present invention will be described.

The application range of a semiconductor device of the invention is so wide that it may be applied to any product in order that the information of the object such as the history is revealed without contact and utilized in production, management, and the like. For example, such an RFID tag may be incorporated in bills, coins, securities, certificates, bearer bonds, containers for packaging, books, recording media, personal belongings, vehicles, foods, clothes, healthcare items, consumer products, medicals, and electronic devices. Examples of these products are described with reference to FIGS. 10A to 10H.

Figure 10A:
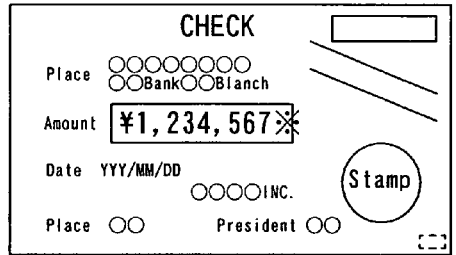
FIGS. 10A to 10H are diagrams showing examples usage patterns of semiconductor devices of the present invention.
Figure 10B:
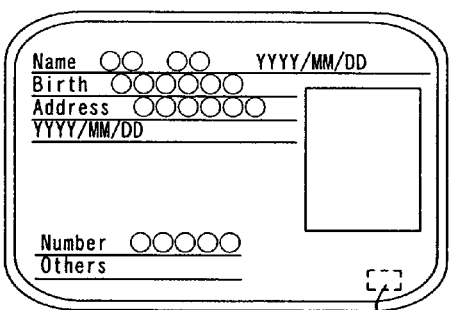
Figure 10C:
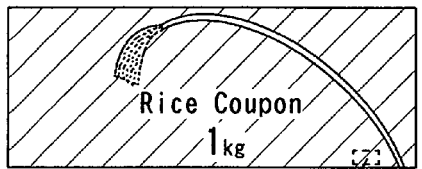
Figure 10D:
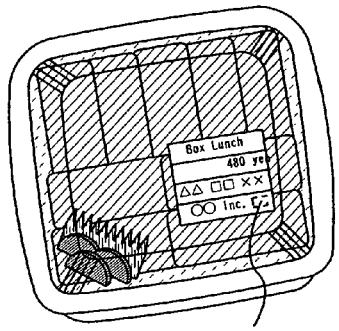
Figure 10E:
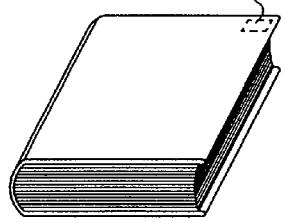
Figure 10F:
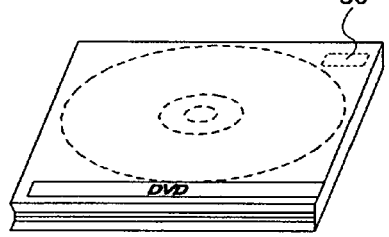
Figure 10G:
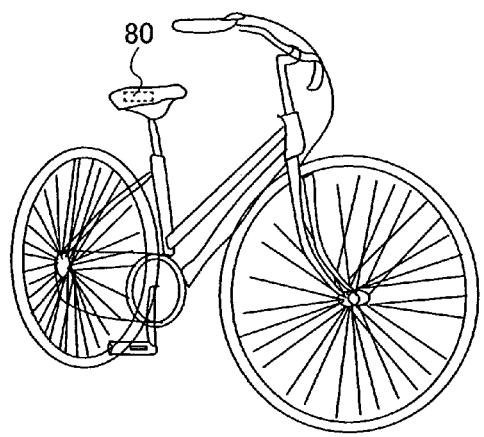
Figure 10H:
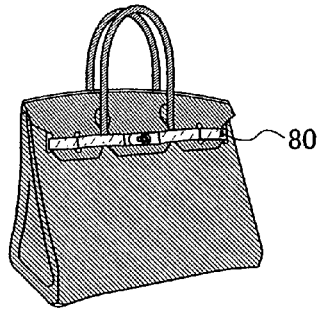

The bills and coins include currency in the market and include notes that are current as money in a specific area (cash voucher), memorial coins, and the like. The securities include a check, a certificate, a promissory note, and the like (FIG. 10A). The certificates include a driver's license, a resident card, and the like (FIG. 10B). The bearer bonds include a stamp, a rice coupon, various gift coupons, and the like (FIG. 10C). The containers for packaging include paper for wrapping a box lunch or the like, a plastic bottle, and the like (FIG. 10D). The books include a document and the like (FIG. 10E). The recording media include DVD software, a video tape, and the like (FIG. 10F). The vehicles include a wheeled vehicle such as a bicycle, a vessel, and the like (FIG. 10G). The personal belongings include a bag, glasses, and the like (FIG. 10H). The foods include food items, beverages, and the like. The clothes include clothing, footwear, and the like. The healthcare items include a medical device, a health appliance, and the like. The consumer products include furniture, a lighting apparatus, and the like. The medicals include a medicine, an agricultural chemical, and the like. The electronic devices include a liquid crystal display device, an EL display device, a television set (television receiver, thin television receiver), a cellular phone, and the like.

When a semiconductor device 80 is incorporated in bills, coins, securities, certificates, bearer bonds, and the like, forgery of them can be prevented. When the semiconductor device 80 is incorporated in containers for packaging, books, recording media, personal belongings, foods, consumer products, electronic devices, and the like, the efficiency of an inspection system, a system used in a rental shop, or the like can be improved. When the semiconductor device 80 is incorporated in vehicles, healthcare items, medicals, and the like, forgery and theft of them can be prevented and medicines can be prevented from being consumed in a wrong manner. The semiconductor device 80 may be attached to the surface of a product or incorporated into a product. For example, a semiconductor device 80 may be incorporated into paper of a book, or an organic resin of a package.

Thus, when a semiconductor device is incorporated in containers for packaging, recording media, personal belongings, foods, clothes, consumer products, electronic devices, and the like, efficiency of an inspection system, a rental system, and the like can be increased. Provision of a semiconductor device also prevents vehicles from being forged or stolen. In addition, when a semiconductor device is implanted into creatures such as animals, each creature can be identified easily. For example, when a semiconductor device provided with a sensor is implanted into creatures such as domestic animals, not only the year of birth, sex, breed, and the like but also the health condition such as body temperature can be easily managed.

This embodiment mode can be freely combined with any other embodiment modes of the specification.

What is claimed is:

1. A semiconductor device comprising:
   a capacitor portion including a plurality of blocks each including a plurality of capacitor elements, a first wiring, and a second wiring,
   wherein each of the plurality of capacitor elements includes a semiconductor film having a first impurity region and a plurality of second impurity regions provided with the first impurity region interposed therebetween, and a conductive film provided over the first impurity region with an insulating film therebetween,
   wherein the first impurity region comprises one conductivity type impurity element,
   wherein each of the second impurity regions comprises another conductivity type impurity element,
   wherein the conductive film is electrically connected to the first wiring,
   wherein the second wiring has a shape including a plurality of loops,
   wherein each of the plurality of blocks comprises a unit comprising:
   one of the plurality of loops; and
   a set of some of the plurality of capacitor elements,
   wherein all of the first impurity regions of the set of the capacitor elements are surrounded by the one of the plurality of loops,
   wherein all of the second impurity regions of the set of the capacitor elements are electrically connected to the one of the plurality of loops, and
   wherein the plurality of capacitor elements are connected in parallel with each other.

2. The semiconductor device according to claim 1,
   wherein concentration of the one conductivity type impurity element contained in the first impurity region is lower than concentration of the another conductivity type impurity element contained in the second impurity regions.

3. The semiconductor device according to claim 1, wherein the first wiring and the second wiring are provided on one plane.

4. The semiconductor device according to claim 1, wherein the plurality of capacitor elements provided in the plurality of blocks are connected in parallel with each other.

5. The semiconductor device according to claim 1, wherein the first wiring is provided using a material having lower resistance than the conductive film.

6. The semiconductor device according to claim 1, wherein the plurality of blocks comprise a first block and a second block adjacent to the first block, and
wherein a shortest distance between a semiconductor film provided in the first block and a semiconductor film provided in the second block is 20 μm to 200 μm.

7. The semiconductor device according to claim 1 further comprising:
a substrate,
wherein the capacitor portion is provided over the substrate.

8. The semiconductor device according to claim 7, wherein the substrate is one selected from the group consisting of a glass substrate, a quartz substrate, a metal substrate, a ceramic substrate, and a semiconductor substrate.

9. The semiconductor device according to claim 1, wherein the first wiring makes electrical contact with the conductive film in a region not overlapping with the first impurity region.

10. A semiconductor device comprising:
a capacitor portion including a plurality of blocks each including a plurality of capacitor elements, a first wiring, and a second wiring,
wherein each of the plurality of capacitor elements includes a semiconductor film having a first impurity region and a plurality of second impurity regions provided with the first impurity region interposed therebetween, and a conductive film provided over the first impurity region with an insulating film therebetween,
wherein the first impurity region comprises one conductivity type impurity element,
wherein each of the second impurity regions comprises another conductivity type impurity element,
wherein the conductive films provided in the plurality of capacitor elements are connected to each other through the first wiring,
wherein the second wiring has a shape including a plurality of loops,
wherein each of the plurality of blocks comprises a unit comprising:
one of the plurality of loops; and
a set of some of the plurality of capacitor elements,
wherein all of the first impurity regions of the set of the capacitor elements are surrounded by the one of the plurality of loops,
wherein all of the second impurity regions of the set of the capacitor elements are electrically connected to the one of the plurality of loops, and
wherein the second impurity regions provided in the plurality of capacitor elements are electrically connected to each other through the second wiring.

11. The semiconductor device according to claim 10, wherein concentration of the one conductivity type impurity element contained in the first impurity region is lower than concentration of the another conductivity type impurity element contained in the second impurity regions.

12. The semiconductor device according to claim 10, wherein the first wiring and the second wiring are provided on one plane.

13. The semiconductor device according to claim 10, wherein the plurality of capacitor elements provided in the plurality of blocks are connected in parallel with each other.

14. The semiconductor device according to claim 10, wherein the first wiring is provided using a material having lower resistance than the conductive film.

15. The semiconductor device according to claim 10, wherein the plurality of blocks comprise a first block and a second block adjacent to the first block, and
wherein a shortest distance between a semiconductor film provided in the first block and a semiconductor film provided in the second block is 20 μm to 200 μm.

16. The semiconductor device according to claim 10 further comprising:
a substrate,
wherein the capacitor portion is provided over the substrate.

17. The semiconductor device according to claim 16, wherein the substrate is one selected from the group consisting of a glass substrate, a quartz substrate, a metal substrate, a ceramic substrate, and a semiconductor substrate.

18. The semiconductor device according to claim 10, wherein the first wiring makes electrical contact with the conductive film in a region not overlapping with the first impurity region.

* * * * *

UNITED STATES PATENT AND TRADEMARK OFFICE
CERTIFICATE OF CORRECTION

| | | |
|---|---|---|
| PATENT NO. | : 8,558,238 B2 | Page 1 of 1 |
| APPLICATION NO. | : 11/802458 | |
| DATED | : October 15, 2013 | |
| INVENTOR(S) | : Atsumi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 764 days.

Signed and Sealed this
Third Day of May, 2016

Michelle K. Lee
*Director of the United States Patent and Trademark Office*